(12) United States Patent
Huh et al.

(10) Patent No.: US 11,539,002 B2
(45) Date of Patent: Dec. 27, 2022

(54) LIQUID CRYSTAL COMPOSITION AND USE THEREOF

(71) Applicant: LG CHEM, LTD., Seoul (KR)

(72) Inventors: Eun Soo Huh, Daejeon (KR); Sin Young Kim, Daejeon (KR); Ji Youn Lee, Daejeon (KR); Eun Hye Lee, Daejeon (KR); Moon Soo Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 201 days.

(21) Appl. No.: 16/768,579

(22) PCT Filed: Dec. 19, 2018

(86) PCT No.: PCT/KR2018/016220
§ 371 (c)(1),
(2) Date: May 29, 2020

(87) PCT Pub. No.: WO2019/124964
PCT Pub. Date: Jun. 27, 2019

(65) Prior Publication Data
US 2021/0175437 A1     Jun. 10, 2021

(30) Foreign Application Priority Data
Dec. 22, 2017   (KR) ........................ 10-2017-0178124

(51) Int. Cl.
*H01L 51/00*      (2006.01)
*C09K 19/38*      (2006.01)
(Continued)

(52) U.S. Cl.
CPC .......... *H01L 51/0076* (2013.01); *C09K 19/38* (2013.01); *G02B 5/305* (2013.01); *G02B 5/3083* (2013.01); *H01L 51/5293* (2013.01)

(58) Field of Classification Search
CPC . H01L 51/0076; H01L 51/5293; C09K 19/38; G02B 5/305; G02B 5/3083
(Continued)

(56) References Cited

U.S. PATENT DOCUMENTS 7,163,723 B2    1/2007   Tanaka et al.
9,174,368 B2   11/2015   Iida et al.
(Continued)

FOREIGN PATENT DOCUMENTS

CN    101408634    4/2009
CN    103348279   10/2013
(Continued)

OTHER PUBLICATIONS

International Search Report and the Written Opinion of PCT/KR2018/016220, dated Mar. 27, 2019.
(Continued)

*Primary Examiner* — Charles S Chang
(74) *Attorney, Agent, or Firm* — Dentons US LLP

(57) ABSTRACT

Provided is a liquid crystal composition and a use thereof. The liquid crystal composition has a reverse-wavelength dispersion property and excellent high-temperature durability, and the liquid crystal composition can be applied to a retardation layer, a circularly polarizing plate, or a display device, for example, an organic light emitting display device.

14 Claims, 3 Drawing Sheets

(51) Int. Cl.
    *G02B 5/30* (2006.01)
    *H01L 51/52* (2006.01)
(58) Field of Classification Search
    USPC .................................................. 349/117–121
    See application file for complete search history.

(56) References Cited

U.S. PATENT DOCUMENTS

| | | |
|---|---|---|
| 9,206,355 B2 | 12/2015 | Choi et al. |
| 9,239,491 B2 | 1/2016 | Kim et al. |
| 9,638,849 B2 | 5/2017 | Matsuyama et al. |
| 9,995,865 B2 | 6/2018 | Aimatsu et al. |
| 10,034,500 B2 | 7/2018 | Kaneko et al. |
| 10,316,252 B2 | 6/2019 | Katoh et al. |
| 10,533,137 B2 | 1/2020 | Ikeda et al. |
| 10,955,601 B2 | 3/2021 | Atsumi et al. |
| 10,989,850 B2 | 4/2021 | Lee et al. |
| 2009/0195734 A1 | 8/2009 | Hayashi et al. |
| 2018/0002460 A1 | 1/2018 | Endo et al. |
| 2018/0016502 A1 | 1/2018 | Endo et al. |
| 2018/0356578 A1* | 12/2018 | Atsumi ................ G02B 5/3083 |
| 2018/0370184 A1* | 12/2018 | Ito ..................... C09K 19/3852 |
| 2019/0233565 A1 | 8/2019 | Endo et al. |
| 2020/0075896 A1* | 3/2020 | Muramatsu ......... H01L 51/5271 |
| 2020/0200958 A1* | 6/2020 | Lee ..................... G02B 27/288 |

FOREIGN PATENT DOCUMENTS

| | | |
|---|---|---|
| CN | 104245885 | 12/2014 |
| CN | 104737044 A | 6/2015 |
| CN | 104950373 A | 9/2015 |
| CN | 105408781 A | 3/2016 |
| CN | 105860995 | 8/2016 |
| CN | 106336875 | 1/2017 |
| CN | 106573870 A | 4/2017 |
| CN | 107108775 A | 8/2017 |
| CN | 107207652 | 9/2017 |
| CN | 107209309 A | 9/2017 |
| CN | 107406769 | 11/2017 |
| JP | H08-321381 | 12/1996 |
| JP | H09-292523 | 11/1997 |
| JP | 2007-086399 | 4/2007 |
| JP | 2008-164921 | 7/2008 |
| JP | 2015-083728 | 4/2015 |
| JP | 2015-085342 | 5/2015 |
| JP | 2016-050322 | 4/2016 |
| JP | 2016-050660 | 4/2016 |
| JP | 2016-050661 | 4/2016 |
| JP | 2016-050663 | 4/2016 |
| JP | 2016-050984 | 4/2016 |
| JP | 2017-002201 | 1/2017 |
| KR | 10-20170105015 | 9/2017 |
| KR | 10-20170105016 | 9/2017 |
| KR | 10-20170105041 | 9/2017 |
| WO | 2017-010560 | 1/2017 |
| WO | 2017-043438 | 3/2017 |
| WO | 2017-110631 | 6/2017 |
| WO | 2017-145935 | 8/2017 |

OTHER PUBLICATIONS

Search Report of Taiwanese Patent Office in Appl'n No. 107146159, dated Dec. 22, 2017.

* cited by examiner

[Figure 1]
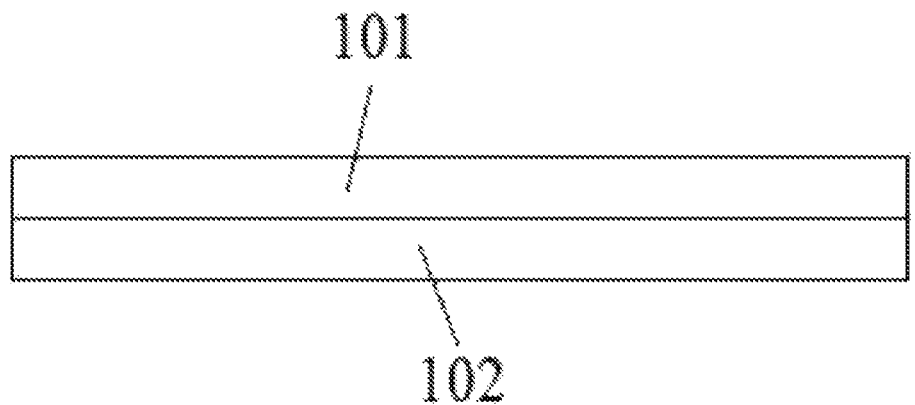
[Figure 2]
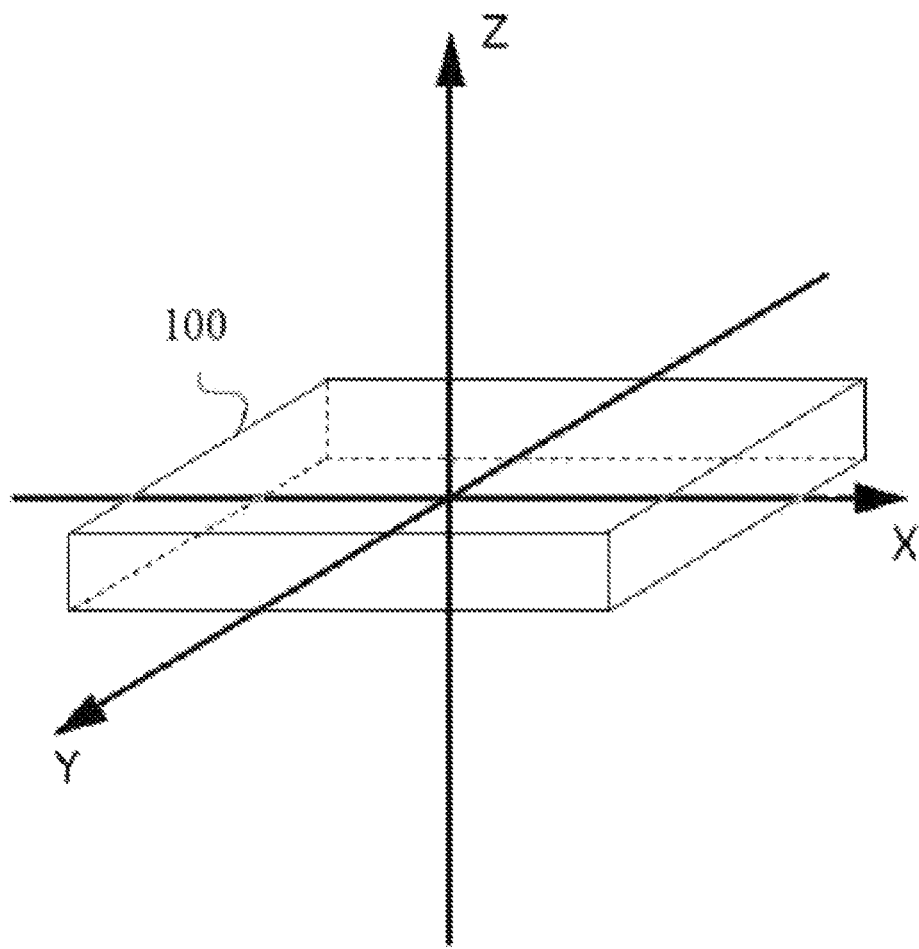

[Figure 3]
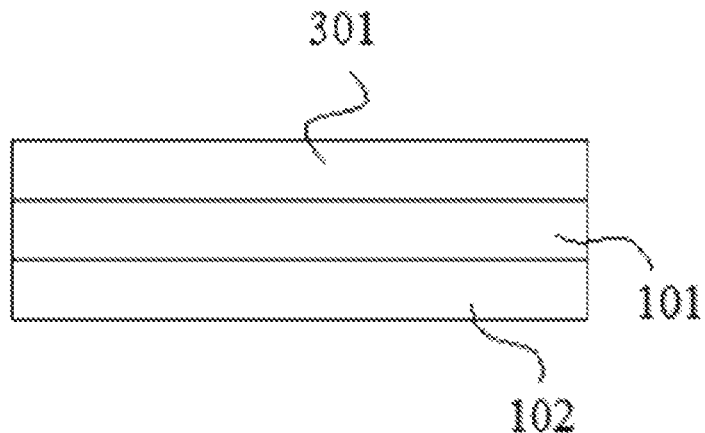
[Figure 4]
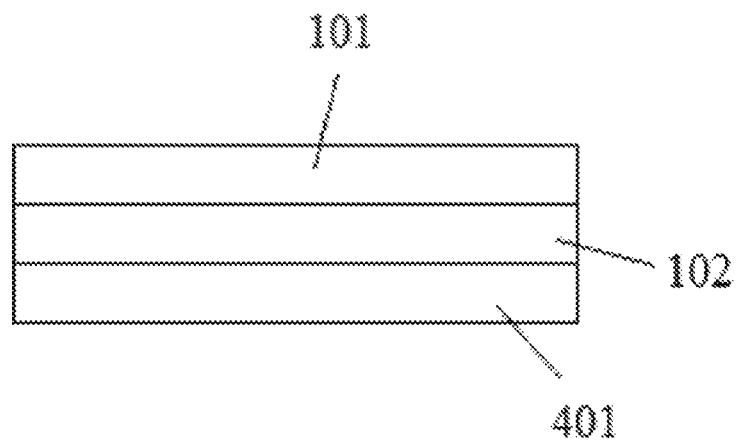

[Figure 5]
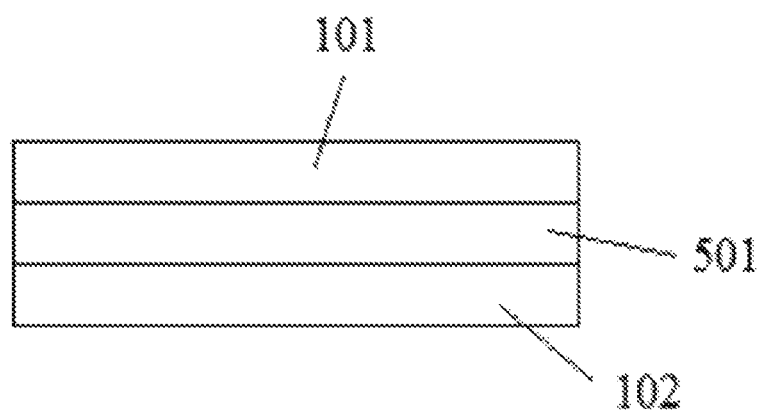

LIQUID CRYSTAL COMPOSITION AND USE THEREOF

CROSS-REFERENCE TO RELATED APPLICATION(S)

This application is a National Stage Application of International Application No. PCT/KR2018/016220 filed on Dec. 19, 2018, which claims the benefit of priority based on Korean Patent Application No. 10-2017-0178124 filed on Dec. 22, 2017, the disclosure of which is incorporated herein by reference in its entirety.

TECHNICAL FIELD

The present application relates to a liquid crystal composition and a use thereof.

BACKGROUND

A retardation layer can be used for various applications.

The retardation layer can be disposed on one side or both sides of liquid crystal cells, for example, in order to improve viewing angle characteristics of an LCD (liquid crystal display). The retardation film is also used for preventing reflection and securing visibility, and the like in a reflective LCD or an OLED (organic light emitting device) and the like (Patent Document 1: JP-A-1996-321381).

The retardation layer includes a ½ wavelength or a ¼ wavelength retardation layer and the like depending on retardation properties. A retardation layer having a reverse wavelength dispersion property can be used so as to exhibit a desired retardation property in a wide wavelength range.

The retardation layer having a reverse wavelength dispersion property can be produced, for example, by curing a liquid crystal composition having a reverse wavelength dispersion property. However, a liquid crystal composition having a reverse wavelength dispersion property has a problem that retardation is lowered at the time of evaluating heat resistance after curing.

DETAILED DESCRIPTION

Technical Problem

The present application provides a liquid crystal composition having a reverse wavelength dispersion property and excellent high temperature durability and a use thereof.

Technical Solution

The present application relates to a liquid crystal composition. An exemplary liquid crystal composition can comprise a polymerizable liquid crystal compound having a reverse wavelength dispersion property and a non-liquid crystalline epoxy compound having two or more epoxy groups. The polymerizable liquid crystal compound having the reverse wavelength dispersion property can be abbreviated as a reverse dispersion liquid crystal.

The reverse dispersion liquid crystal can have a low degree of curing because the size of the molecules is larger than that of the normal dispersion liquid crystal. The reverse dispersion liquid crystal is not sufficiently cured even under the same curing conditions as compared to the normal dispersion liquid crystal, so that the durability can be weak and the retardation value can be decreased at high temperature. The liquid crystal composition of the present application can reduce a free volume present in the cured product of the reverse dispersion liquid crystal by adding a non-liquid crystalline epoxy compound to the reverse dispersion liquid crystal. Accordingly, it can ensure durability even after lowering the curing conditions for securing appearance to suppress reduction in the retardation value at high temperature.

The polymerizable liquid crystal compound can satisfy the following Equation 1 as the reverse wavelength dispersion property.

$$R(450)/R(550) < R(650)/R(550) \quad \text{[Equation 1]}$$

In comparison with the reverse wavelength dispersion property, the characteristic of the following Equation 2 can mean a normal wavelength dispersion property, and the following Equation 3 can mean a flat wavelength dispersion property.

$$R(450)/R(550) > R(650)/R(550) \quad \text{[Equation 2]}$$

$$R(450)/R(550) = R(650)/R(550) \quad \text{[Equation 3]}$$

In this specification, R ($\lambda$) can mean an in-plane retardation for light having a wavelength of $\lambda$ nm. In Equations 1 to 3, R (450) is an in-plane retardation for light having a wavelength of 450 nm, R (550) is an in-plane retardation for light having a wavelength of 550 nm, and R(650) is an in-plane retardation for light having a wavelength of 650 nm.

In this specification, the in-plane retardation is a value determined according to the following Equation 4, and the thickness direction retardation is a value determined according to the following Equation 5.

$$R\text{in} = d \times (nx - ny) \quad \text{[Equation 4]}$$

$$R\text{th} = d \times (nz - ny) \quad \text{[Equation 5]}$$

In Equations 4 and 5, Rin is an in-plane retardation, Rth is a thickness-direction retardation, d is a thickness of a liquid crystal layer, a cured layer or a retardation layer, and nx, ny and nz are each an x-axis direction (slow axis direction) refractive index, a y-axis direction (fast axis direction) refractive index and a z-axis direction (thickness direction) refractive index of a liquid crystal layer, a cured layer or a retardation layer, where these definitions can be equally applied to this specification, unless otherwise specified. When the liquid crystal compound has a rod shape, the x-axis direction can mean the long axis direction of the rod shape, the y-axis direction can mean the short axis direction of the rod shape and the z-axis direction can mean the direction of the normal of the plane formed by the x-axis and the y-axis. When the liquid crystal compound has a disk shape, the x-axis direction can mean the normal direction of the disc plate of the disk shape, the y-axis direction can mean the diameter direction of the disk shape and the z-axis direction can mean the direction of the normal of the plane formed by the x-axis and the y-axis.

According to Equation 4, in the in-plane retardation for light with a wavelength of 450 nm, as nx and ny in Equation 4, the refractive index for light with a wavelength of 450 nm is applied; in the in-plane retardation for light with a wavelength of 550 nm, as nx and ny in Equation 4, the refractive index for light with a wavelength of 550 nm is applied; and in the in-plane retardation for light with a wavelength of 650 nm, as nx and ny in Equation 4, the refractive index for light with a wavelength of 650 nm is applied.

In this specification, the polymerizable liquid crystal compound having a reverse wavelength dispersion property can mean a polymerizable liquid crystal compound that the liquid crystal layer, cured layer or retardation layer formed by curing the polymerizable liquid crystal compound alone exhibits the reverse wavelength dispersion property of Equation 1 above.

In this specification, unless otherwise specified in describing the wavelength dispersion property and the retardation value, they can mean a wavelength dispersion property and a retardation value for a liquid crystal layer, a cured layer or a retardation layer formed by curing a polymerizable liquid crystal compound in a state of being oriented on the xy plane.

The polymerizable liquid crystal compound can have an R (450)/R (550) value of 0.99 or less. In one example, R (450)/R (550) in Equation 1 can be in a range of 0.6 to 0.99. In another example, R (450)/R (550) can be 0.61 or more, 0.62 or more, 0.63 or more, 0.64 or more, 0.65 or more, 0.66 or more, 0.67 or more, 0.69 or more, 0.70 or more, 0.71 or more, 0.72 or more, 0.73 or more, 0.74 or more, 0.75 or more, 0.76 or more, 0.77 or more, 0.78 or more, 0.79 or more, 0.80 or more, 0.81 or more, 0.82 or more, 0.83 or more, or 0.84 or more. In another example, the R (450)/R (550) can be 0.98 or less, 0.97 or less, 0.96 or less, 0.95 or less, 0.94 or less, 0.93 or less, 0.92 or less, 0.91 or less, 0.90 or less, 0.89 or less, 0.88 or less, 0.87 or less, 0.86 or less, or 0.85 or less.

The polymerizable liquid crystal compound can have an R (650)/R (550) value of 1.01 or more. R (650)/R (550) in Equation 1 can be in a range of 1.00 to 1.19. The R (650)/R (550) can be 1.18 or less, 1.17 or less, 1.16 or less, 1.15 or less, 1.14 or less, 1.13 or less, 1.12 or less, or 1.11 or less. In another example, R (650)/R (550) in Equation 1 can be 1.01 or more, 1.02 or more, 1.03 or more, 1.04 or more, 1.05 or more, 1.06 or more, 1.07 or more, 1.08 or more, or 1.09 or more.

The polymerizable liquid crystal compounds having the R (450)/R (550) and/or R (650)/R (550) values are not particularly limited. Polymerizable liquid crystal compounds having R (450)/R (550) and/or R (650)/R (550) in the above range are known as polymerizable liquid crystal compounds having reverse wavelength dispersion properties in this field, and such a liquid crystal compound can be selected and used.

The birefringence of the polymerizable liquid crystal compound is known to be mainly determined by a molecular conjugation structure, differential oscillator strength and an order parameter, where in order for the polymerizable liquid crystal compound to exhibit high birefringence, a large electron density is required in the direction of the main axis and thus, most of the polymerizable liquid crystal compounds have a highly conjugated shape in the long axis direction.

In order for the polymerizable liquid crystal compound to exhibit the reverse wavelength dispersion property, it is necessary to tune the birefringence between the long axis and the axis perpendicular to the long axis, and accordingly, most of the polymerizable liquid crystal compounds designed to have the reverse wavelength dispersion property can have a shape that the main axis (long axis) has a large retardation and a small dispersion value and the axis perpendicular to the main axis has a small retardation and a large dispersion value, while having T or H type molecular shapes.

For example, among the polymerizable liquid crystal compounds disclosed in PCT-JP2015-083728, PCT-JP2015-085342, PCT-JP2016-050322, PCT-JP2016-050660, PCT-JP2016-050661, PCT-JP2016-050984 and PCT-JP2016-050663, some polymerizable liquid crystal compounds are polymerizable liquid crystal compounds having a reverse wavelength dispersion property, and in the present application, such polymerizable liquid crystal compounds can be used, but the type of the applicable polymerizable liquid crystal compound in the present application is not limited thereto, and various types of polymerizable liquid crystal compounds can be used as far as they have a reverse wavelength dispersion property.

The polymerizable liquid crystal compound can have refractive index anisotropy (Δn) of 0.03 to 0.13 for light having a wavelength of 550 nm. In this specification, the refractive index anisotropy can mean a difference (ne-no) between an extraordinary refractive index (ne) and an ordinary refractive index (no) of a liquid crystal compound. The extraordinary refractive index can mean a refractive index for the slow axis direction of the liquid crystal compound, and the ordinary refractive index can mean a refractive index for the fast axis direction of the liquid crystal compound.

In this specification, the term "polymerizable liquid crystal compound" can mean a compound containing a moiety capable of exhibiting liquid crystallinity, such as a mesogen skeleton, and also containing one or more polymerizable functional groups. Such polymerizable liquid crystal compounds are variously known under the so-called RM (reactive mesogen). The polymerizable liquid crystal compound can be contained in the polymerized form in a cured layer to be described below, which can mean a state where the liquid crystal compound is polymerized to form skeletons of the liquid crystal polymer such as main chains or side chains in the cured layer.

The polymerizable liquid crystal compound can be a monofunctional or multifunctional polymerizable liquid crystal compound. Here, the monofunctional polymerizable liquid crystal compound can be a compound having one polymerizable functional group and the multifunctional polymerizable liquid crystal compound can mean a compound containing two or more polymerizable functional groups. In one example, the multifunctional polymerizable liquid crystal compound can comprise 2 to 10, 2 to 8, 2 to 6, 2 to 5, 2 to 4, 2 to 3, or 2 or 3 polymerizable functional groups. The liquid crystal composition can comprise polymerizable liquid crystal compounds having the same polymerizable functional group or two or two or more polymerizable liquid crystal compounds having different polymerizable functional groups.

The polymerizable functional group can be, for example, an alkenyl group, an epoxy group, a carboxyl group, an acryloyl group, a methacryloyl group, an acryloyloxy group or a methacryloyloxy group, but is not limited thereto.

Such a polymerizable liquid crystal compound can be included in an amount of 20 to 45 parts by weight relative to 100 parts by weight of the liquid crystal composition. Within this range, the liquid crystal composition can exhibit suitable reverse wavelength dispersion properties. The ratio of the polymerizable liquid crystal compound in the cured layer of the liquid crystal composition can also be in the above-mentioned range.

In one example, the reverse wavelength dispersible polymerizable liquid crystal compound can be a compound of the following Formula 1:

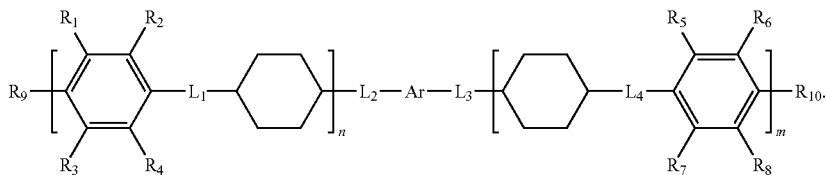

Formula 1

In Formula 1, Ar is an aromatic group having a heterocycle; $L_1$ to $L_4$ each independently is a single bond, an alkylene group, an alkenylene group, an alkynylene group, —COO—, —OCO— or —O-$Q_1$-; $R_1$ to $R_{10}$ each independently is hydrogen, halogen, an alkyl group, an alkenyl group, an alkynyl group, an alkoxy group, an alkoxycarbonyl group, a cyano group, a nitro group, —O-$Q_2$-$P_1$, -[$Q_3$-COO]$_{a1}$-$Q_4$-$P_2$ or -[$Q_5$-COO]$_{a2}$-$Q_6$-O-$Q_7$-$P_3$, where $Q_1$ to $Q_7$ are each independently an alkylene group, an alkenylene group or an alkynylene group, $P_1$ to $P_3$ are each a polymerizable functional group, and a1 and a2 are each independently an integer of 1 to 4; and n and m are each independently an integer of 1 to 10, and Formula 1 above comprises one or more polymerizable functional groups.

In Formula 1, Ar is an aromatic group having a heterocycle, where the heterocycle can be bonded to one substituent in the aromatic group or two adjacent substituents of the aromatic group substituents can be connected to form the heterocycle.

In one example, Ar in Formula 1 above can be one of the following Formulae 2 to 4.

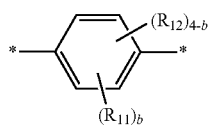

Formula 2

In Formula 2, * can mean a binding site to $L_2$ and $L_3$ of Formula 1. In Formula 2, $R_{11}$ is a substituent of the following Formula 5, each Ria is independently hydrogen, halogen, an alkyl group, an alkenyl group, an alkynyl group, an alkoxy group, an alkoxycarbonyl group, a cyano group, a nitro group or —O-$Q_8$-$P_4$, wherein $Q_8$ is an alkylene group, an alkenylene group or an alkynylene group and $P_4$ is a polymerizable functional group, and b is an integer of 1 to 3.

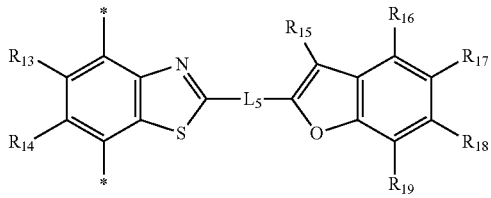

Formula 3

In Formula 3, * means a binding site to $L_2$ and $L_3$ of Formula 1. In Formula 3, $L_5$ is a single bond, an alkylene group, an alkenylene group, an alkynylene group, —COO—, —OCO—, —O-$Q_9$-, and $R_{13}$ to $R_{19}$ are each independently hydrogen, halogen, an alkyl group, an alkenyl group, an alkynyl group, an alkoxy group, an alkoxycarbonyl group, a cyano group, a nitro group or —O-$Q_{10}$-$P_5$, where $Q_9$ and $Q_{10}$ are each independently an alkylene group, an alkenylene group or an alkynylene group and $P_5$ is a polymerizable functional group.

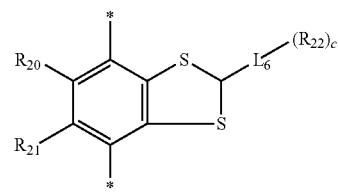

Formula 4

In Formula 4, * means a binding site to $L_2$ and $L_3$ of Formula 1. In Formula 4, $L_7$ is a single bond, an alkylene group, an alkenylene group, an alkynylene group, —COO—, —OCO— or —O-$Q_{11}$-, $R_{21}$ to $R_{23}$ are each independently hydrogen, halogen, an alkyl group, an alkenyl group, an alkynyl group, an alkoxy group, an alkoxycarbonyl group, a cyano group, a nitro group or —O-$Q_{11}$-$P_6$, where $Q_{11}$ is an alkylene group, an alkenylene group or an alkynylene group and $P_6$ is a polymerizable functional group, and c is an integer of 1 or 2.

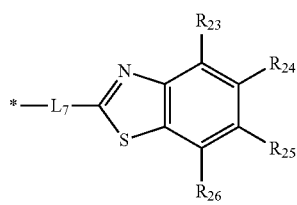

Formula 5

In Formula 5, * means a binding site to the benzene of Formula 2. In Formula 5, $L_7$ can be a single bond, an alkylene group, an alkenylene group, an alkynylene group, —COO—, —OCO—, —O-$Q_{12}$- or the following formula 6, and $R_{23}$ to $R_{26}$ are each independently hydrogen, halogen, an alkyl group, an alkenyl group, an alkynyl group, an alkoxy group, an alkoxycarbonyl group, a cyano group, a nitro group, —O-$Q_{13}$-$P_7$, -[$Q_{14}$-OCO]$_{a3}$-$Q_{15}$-$P_8$ or -[$Q_{16}$-OCO]$_{a4}$-$Q_{17}$-O-$Q_{18}$-$P_9$, where $Q_{12}$ to $Q_{18}$ are each independently an alkylene group, an alkenylene group or an alkynylene group, $P_8$ and $P_9$ are each independently a polymerizable functional group and a3 to a4 are each independently an integer of 1 to 4.

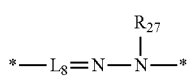

Formula 6

In Formula 6, *s mean binding sites to the benzene of Formula 2, and Formula 5. In Formula 6, $L_8$ can be a single bond, an alkenyl group, an alkenylene group or an alkynylene group, and $R_{27}$ is hydrogen, halogen, an alkyl group, an alkenyl group, an alkynyl group, an alkoxy group, an alkoxycarbonyl group, a cyano group, a nitro group, -[$Q_{19}$-O]$_{a5}$-$Q_{20}$-$P_{10}$, or -[$Q_{21}$-O]$a_6$-$Q_{22}$, where $Q_{19}$ to $Q_{21}$ are each independently an alkylene group, an alkenylene group or an alkynylene group, $P_{10}$ is a polymerizable functional group and $Q_{23}$ is an alkyl group, an alkenyl group or an alkynyl group.

In this specification, halogen can be exemplified by chlorine, bromine or iodine, and the like.

In this specification, the alkyl group or alkylene group can be a linear or branched alkyl group or alkylidene group having 1 to 20 carbon atoms, 1 to 16 carbon atoms, 1 to 12 carbon atoms, 1 to 8 carbon atoms or 1 to 4 carbon atoms, or can mean a cycloalkyl group or cycloalkylidene group having 3 to 20 carbon atoms, 3 to 16 carbon atoms or 4 to 12 carbon atoms, unless otherwise specified. The alkyl group or alkylene group can be optionally substituted by one or more substituents.

In this specification, the alkenyl group or alkenylene group can be a linear or branched alkenyl group or alkenylene group having 2 to 20 carbon atoms, 2 to 16 carbon atoms, 2 to 12 carbon atoms, 2 to 8 carbon atoms or 2 to 4 carbon atoms, or can mean a cycloalkenyl group or cycloalkenylene group having 3 to 20 carbon atoms, 3 to 16 carbon atoms or 4 to 12 carbon atoms, unless otherwise specified. The alkenyl group or alkenylene group can be optionally substituted by one or more substituents.

In this specification, the alkynyl group or alkynylene group can be a linear or branched alkynyl group or alkynylene group having 2 to 20 carbon atoms, 2 to 16 carbon atoms, 2 to 12 carbon atoms, 2 to 8 carbon atoms or 2 to 4 carbon atoms, or can mean a cycloalkynyl group or cycloalkynylene group having 3 to 20 carbon atoms, 3 to 16 carbon atoms or 4 to 12 carbon atoms, unless otherwise specified. The alkynyl or alkynylene group can be optionally substituted by one or more substituents.

The non-liquid crystalline epoxy compound can be a multifunctional non-liquid crystalline epoxy compound. In this specification, the multifunctional non-liquid crystalline epoxy compound can mean a non-liquid crystalline compound containing two or more epoxy groups. In one example, the multifunctional non-liquid crystalline epoxy compound can comprise 2 to 8, 2 to 7, 2 to 6, 2 to 5, 2 to 4, 2 to 3 or two or three polymerizable functional groups.

When the liquid crystal composition contains a monofunctional non-liquid crystalline epoxy compound containing one epoxy group, the high temperature durability of the polymerizable liquid crystal compound having a reverse wavelength dispersion property can be deteriorated due to un-curing of the polymerizable liquid crystal compound having a reverse wavelength dispersion property. Specifically, when the monofunctional non-liquid crystalline epoxy compound is used, the curing rate is slower than that of the multifunctional non-liquid crystalline epoxy compound and it does not form chains with the cured product of liquid crystals based on radical curing, for example, acrylate curing, so that the un-curing of the liquid crystal compound may occur.

When the liquid crystal composition contains a non-liquid crystalline epoxy compound having an excessively large number of epoxy groups, the total viscosity of the liquid crystal cured product can be increased even when the liquid crystal composition contains a small amount of the compound, and the coating property of the liquid crystal composition can be deteriorated. In addition, in the case of the non-liquid crystalline epoxy compound having an excessively large number of epoxy groups, the radical curing, for example, the acrylate curing of the reverse wavelength dispersible liquid crystals is hindered, so that the high temperature durability can be lowered.

In one example, the non-liquid crystalline epoxy compound may not have a radical-curable functional group. The radical-curable functional group can be exemplified by an acryloyl group, a methacryloyl group, an acryloyloxy group or a methacryloyloxy group, and the like.

The non-liquid crystalline epoxy compound can be an aliphatic epoxy compound or an alicyclic epoxy compound.

The non-liquid crystalline epoxy compound can be a compound of the following Formula 7 or 8.

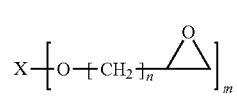

Formula 7

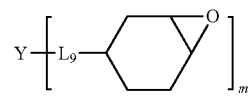

Formula 8

In Formula 7, X can be an m-valent non-mesogenic hydrocarbon group, n can be an integer of 1 to 20, and m can be an integer of 2 or more.

In Formula 8, Y can be an m-valent non-mesogenic hydrocarbon group, $L_9$ can be a single bond, —OCO—, —COO— or —O—, and m can be an integer of 2 or more.

In this specification, the m-valent hydrocarbon group can mean a hydrocarbon group having m binding sites so as to have m functional groups, for example, m epoxy groups.

In this specification, the non-mesogenic hydrocarbon group can mean a hydrocarbon group having no mesogen skeleton. In this specification, the mesogen skeleton can mean a structure containing at least two aromatic groups.

The non-mesogenic hydrocarbon group can be a non-mesogenic saturated hydrocarbon group or a non-mesogenic unsaturated hydrocarbon group. In one example, X and Y each can be a linear, branched or cyclic m-valent non-mesogenic saturated hydrocarbon group having 1 to 20 carbon atoms, 1 to 16 carbon atoms, 1 to 12 carbon atoms, 1 to 8 carbon atoms, 1 to 4 carbon atoms, or 4 to 8 carbon atoms.

In Formulas 7 and 8, each m determines the number of epoxy groups contained in the epoxy compound. In Formulas 7 and 8, each m can be independently an integer of 2 to 8, an integer of 2 to 7, an integer of 2 to 6, an integer of 2 to 5, an integer of 2 to 4, an integer of 2 to 3, an integer of 2 or 3.

In Formula 7, n can be an integer of 1 to 16, an integer of 1 to 12, an integer of 1 to 8, an integer of 1 to 4, or an integer of 1 to 2. When the number of epoxy groups in Formula 7 is two or more (where m is 2 or more), m ns can be the same or different integers from each other.

In Formula 8, $L_9$ connects an epoxy group to Y, which is a non-mesogenic hydrocarbon group. In the case where two or more epoxy groups are present in Formula 8 (m is 2 or more), m $L_9$s can be the same or different from each other. $L_9$ can be a single bond, —OCO—, —COO— or —O—, and according to one example of the present application, $L_9$ can be a single bond or —OCO—.

In one example, the non-liquid crystalline epoxy compound can be one of the following Formulae 9 to 14.

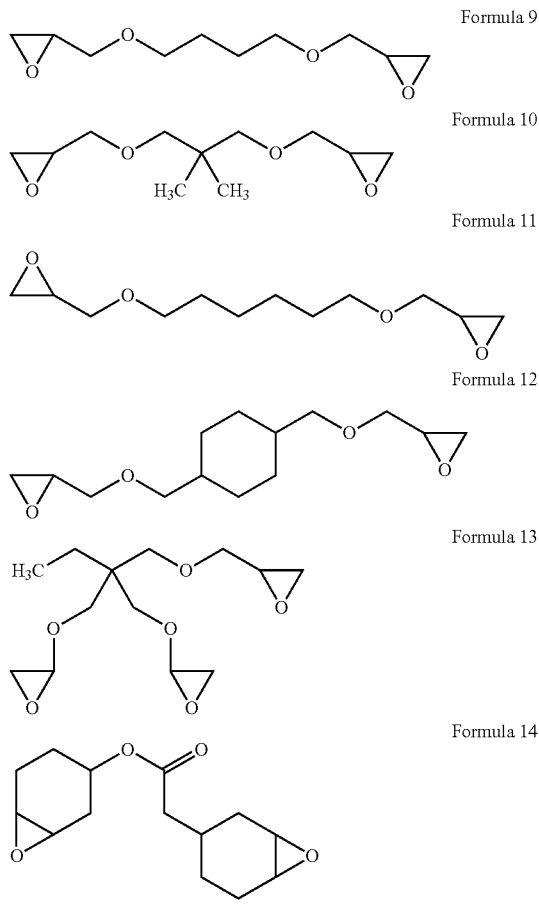

Formula 9

Formula 10

Formula 11

Formula 12

Formula 13

Formula 14

The non-liquid crystalline epoxy compound can be contained in a ratio of 1 to 20 parts by weight relative to 100 parts by weight of the polymerizable liquid crystal compound. The content ratio can be specifically 1 part by weight or more, 3 parts by weight or more, 6 parts by weight or more, or 9 parts by weight or more, and can be 20 parts by weight or less, 17 parts by weight or less, 14 parts by weight or less, or 11 parts by weight or less. When the content ratio of the non-liquid crystalline epoxy compound is within the above range, it can be advantageous from the viewpoint of improving the high temperature durability. The ratio of the non-liquid crystalline epoxy compound in the cured layer of the liquid crystal composition can also be in the above-mentioned range.

An exemplary liquid crystal composition can further comprise a cationic initiator. As the cationic initiator, ionized cationic initiators of onium salts or organometallic salt series or nonionized cationic initiators such as organosilanes or latent sulfonic acid series or other nonionized compounds can be used. As the initiator of the onium salt series, diaryliodonium salt, triarylsulfonium salt or aryldiazonium salt, and the like can be exemplified; as the initiator of the organometallic salt series, iron arene and the like can be exemplified; as the initiator of the organosilane series, o-nitrobenzyl triaryl silyl ether, triaryl silyl peroxide or acyl silane, and the like can be exemplified; and as the initiator of the latent sulfuric acid series, a-sulfonyloxy ketone or a-hydroxymethylbenzoin sulfonate, and the like can be exemplified; without being limited thereto. Furthermore, as the cationic initiator, a mixture of an iodine series initiator and a photosensitizer can also be used. Such a photosensitizer can be exemplified by an anthracene compound, a pyrene compound, a carbonyl compound, an organic sulfur compound, a persulfide, a redox compound, azo and diazo compounds, a halogen compound or a photo-reducible pigment, and the like.

The cationic initiator can be included, for example, in an amount of 0.01 to 3 parts by weight relative to 100 parts by weight of the total liquid crystal composition. The cationic initiator can be included, for example, in an amount of 1 to 15 parts by weight relative to 100 parts by weight of the non-liquid crystalline epoxy compound. The content can be specifically 1 part by weight or more, 3 parts by weight or more, 6 parts by weight or more, or 9 parts by weight or more, and 15 parts by weight or less, 13 parts by weight or less, or 11 parts by weight or less. When the content of the cationic initiator is within the above range, it can be advantageous to provide a liquid crystal composition which exhibits reverse wavelength dispersion property while ensuring high temperature durability.

An exemplary liquid crystal composition can further comprise a solvent. The solvent can include aromatic hydrocarbons such as toluene, benzene and xylene; aliphatic hydrocarbons such as cyclohexane and decalin; esters such as ethyl acetate and butyl acetate; ketones such as acetone, methyl ethyl ketone and methyl isobutyl ketone; alcohols such as methanol, ethanol, isopropanol, butanol, isobutanol, methyl cellosolve, ethyl cellosolve and butyl cellosolve; ethers such as tetrahydrofuran and dioxane; halogenated hydrocarbons such as dichloromethane, chloroform and carbon tetrachloride; dimethylformamide; dimethyl sulfoxide and the like. These solvents can be used alone or in combination of two or more.

An exemplary liquid crystal composition can have excellent high temperature durability. The liquid crystal composition can have a small change rate of retardation in heat resistance evaluation after curing.

After the exemplary liquid crystal composition is irradiated with ultraviolet rays of UVB region wavelengths at a light quantity of 100 mJ/cm$^2$ to 250 mJ/cm$^2$ in the total irradiance level and cured, it can have an in-plane retardation change rate of 8% or less, 7% or less, 6% or less, 5% or less, 4% or less, or 3% or less in the following formula 6. In this specification, the UVB can mean ultraviolet rays having a wavelength region of about 280 nm to 315 nm.

$$\Delta Rin = (1 - Rin_2/Rin_1) \times 100 \quad \text{[Equation 6]}$$

$\Delta$Rin is an in-plane retardation change rate after high temperature storage, Rim is an initial in-plane retardation value, and Rina is an in-plane retardation value after high temperature storage at 80° C. for 96 hours. The initial in-plane retardation value means an in-plane retardation value at room temperature before high temperature storage. In this specification, the room temperature can mean a temperature without artificially controlling the temperature.

The room temperature can mean, for example, a temperature in a range of 20 degrees to 40 degrees or a range of 20 degrees to 30 degrees.

The effect of improving the high-temperature durability in the liquid crystal composition can be significant in the liquid crystal composition having a reverse wavelength dispersion property. When the liquid crystal composition comprises a polymerizable liquid crystal compound having a reverse wavelength dispersion property and does not comprise a non-liquid crystalline epoxy compound, the in-plane retardation change rate can be more than 8% after curing and high temperature storage under the same conditions as above. However, when the liquid crystal composition comprises a polymerizable liquid crystal compound having a normal wavelength dispersion property or a flat wavelength dispersion property and does not comprise a non-liquid crystalline epoxy compound, the in-plane retardation change rate can be 3% or less after curing and high temperature storage under the same conditions as above.

The present application relates to a use of a liquid crystal compound. The liquid crystal composition can be used for providing a retardation layer. An exemplary retardation layer can comprise a cured layer of the liquid crystal composition. The cured layer can comprise the polymerizable liquid crystal compound in a polymerized state. In the present application, the fact that the polymerizable liquid crystal compound is included in a polymerized state can mean a state where the liquid crystal compound is polymerized to form a skeleton such as main chains or side chains of the liquid crystal polymer in the layer. The cured layer can also comprise a polymerizable liquid crystal compound in a horizontally oriented state. In the present application, the horizontal orientation can mean a case that the optical axis of the polymerized layer comprising the polymerized liquid crystal compound has an inclination angle of about 0 degrees to about 25 degrees, about 0 degrees to about 15 degrees, about 0 degrees to about 10 degrees, about 0 degree to about 5 degrees or about 0 degrees to the plane of the polymerized layer. In the present application, the optical axis can mean, for example, a fast axis or a slow axis when the incident light transmits through the corresponding region.

The retardation layer can further comprise a base layer and/or an alignment film. The cured layer can be provided on the base layer or the alignment film.

As the base layer, a known material can be used without any particular limitation. For example, a glass base material, a crystalline or non-crystalline silicon base material, an inorganic base material such as quartz or ITO (indium tin oxide) or a plastic film and the like can be used. As the base layer, an optically isotropic base layer or an optically anisotropic base layer such as a retardation layer can also be used.

As the plastic film, a base layer comprising TAC (triacetyl cellulose); a cycloolefin copolymer (COP) such as a norbornene derivative; PMMA (poly(methyl methacrylate); PC (polycarbonate); PE (polyethylene); PP (polypropylene); PVA (polyvinyl alcohol); DAC (diacetyl cellulose); Pac (polyacrylate); PES (poly ether sulfone); PEEK (polyetheretherketone); PPS (polyphenylsulfone), PEI (polyetherimide); PEN (polyethylene naphthalate); PET (polyethylene terephthalate); PI (polyimide); PSF (polysulfone); PAR (polyarylate), or an amorphous fluororesin and the like can be used, but is not limited thereto. A coating layer of gold, silver, or a silicon compound such as silicon dioxide or silicon monoxide, or a coating layer such as an antireflection layer can also be present in the base layer, if necessary.

The alignment film can be selected and used without particular limitation as long as it has orientation ability with respect to the adjacent liquid crystal layer. For example, it can be a contact type alignment film such as a rubbing alignment film, or it is possible to use a photo alignment film which can comprise a photo-orientational compound to exhibit orientation properties by a noncontact manner such as irradiation of linearly polarized light.

The retardation layer can be produced by coating the liquid crystal composition on one side of the base layer or on one side of the alignment film of the base layer on which the alignment film is formed and curing it.

The method of coating the liquid crystal composition on the base layer is not particularly limited, which can be performed by coating through any known coating method such as roll coating, printing method, inkjet coating, a slit nozzle method, bar coating, comma coating, spin coating or gravure coating.

The curing method of the liquid crystal composition is not particularly limited, which can be performed by a known liquid crystal compound polymerization method. For example, it can be performed by a method of maintaining an appropriate temperature or a method of irradiating it with an appropriate active energy ray so that the polymerization reaction can be initiated. When the maintenance at an appropriate temperature and the irradiation of an active energy ray are simultaneously required, the above processes can proceed sequentially or simultaneously. Here, The irradiation of the active energy ray can be performed using, for example, a high-pressure mercury lamp, an electrodeless lamp or a xenon lamp, and the like, and the conditions such as the wavelength, light intensity or light quantity of the irradiated active energy ray can be selected within a range that the polymerization of the polymerizable liquid crystal compound can be suitably performed.

The liquid crystal composition and/or the retardation layer can be used for providing a circularly polarizing plate. FIG. 1 exemplarily shows a circularly polarizing plate. An exemplary circularly polarizing plate can comprise a polarizer (101) and a retardation layer (102). The retardation layer can comprise a cured layer of the liquid crystal composition. The retardation layer can be laminated on one side of the polarizer.

In this specification, the term polarizer means a film, sheet or element having a polarization function. The polarizer is a functional element capable of extracting light that vibrates in one direction from incident light that vibrates in various directions.

As the polarizer, an absorptive polarizer can be used. In this specification, the absorptive polarizer means an element exhibiting selective transmission and absorption characteristics with respect to incident light. For example, the polarizer can transmit light that vibrates in one direction from incident light that vibrates in various directions, and can absorb light that vibrates in the other directions.

The polarizer can be a linear polarizer. In this specification, the linear polarizer means a case where the selectively transmitting light is linearly polarized light that vibrates in any one direction and the selectively absorbing light is linearly polarized light that vibrates in directions orthogonal to the vibration direction of the linear polarized light.

As the polarizer, for example, a polarizer in which iodine is dyed to a polymer stretched film such as a PVA stretched film, or a guest-host polarizer in which liquid crystals polymerized in an oriented state are used as a host and anisotropic dyes arranged along the orientation of the liquid crystals are used as a guest can be used, without being limited thereto.

According to one example of the present application, a PVA stretched film can be used as the polarizer. The transmittance and the polarization degree of the polarizer can be appropriately adjusted in consideration of the object of the present application. For example, the transmittance of the polarizer can be 42.5% to 55%, and the polarization degree can be 65% to 99.9997%.

The retardation layer can be a layer having a refractive index relationship according to any one of the following Equations 7 to 9.

$$nx>ny=nz \quad \text{[Equation 7]}$$

$$nx>ny>nz \quad \text{[Equation 8]}$$

$$nx>ny \text{ and } nz>ny \quad \text{[Equation 9]}$$

In Equations 7 to 9 above, nx, ny and nz are the refractive index in the x-axis direction (slow axis direction), the refractive index in the y-axis direction (fast axis direction) and the refractive index in the z-axis direction (thickness direction) of the retardation layer. Here, for example, as shown in FIG. 2, the x-axis direction can mean the slow axis direction on the surface of the retardation layer (100) in the form of a film or a sheet, the y-axis direction can mean a planar direction (fast axis direction) perpendicular to the x-axis, and the z-axis direction can mean the direction of the normal of the plane formed by the x-axis and the y-axis, for example, the thickness direction.

The retardation layer can have a quarter-wave phase delay characteristic. In this specification, the term n-wave phase delay characteristic means a characteristic that the incident light can be phase-delayed by n times the wavelength of the incident light within at least a part of the wavelength range. The quarter-wave phase delay characteristic can be a characteristic that the incident linearly polarized light is converted into elliptically polarized light or circularly polarized light and conversely, the incident linearly polarized light or circularly polarized light is converted into linearly polarized light. In one example, the retardation layer can have an in-plane retardation for light having a wavelength of 550 nm in a range of 90 nm to 300 nm. In another example, the in-plane retardation can be 100 nm or more, 105 nm or more, 110 nm or more, 115 nm or more, 120 nm or more, 125 nm or more, or 130 nm or more. In addition, the in-plane retardation can be 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, 145 nm or less, or 140 nm or less.

For the retardation layer, the range of the thickness-direction retardation obtained according to Equation 5 above is not particularly limited, which can be, for example, in a range of about −200 nm to 200 nm. In another example, the thickness-direction retardation can be −190 nm or more, −180 nm or more, −170 nm or more, −160 nm or more, −150 nm or more, −140 nm or more, −130 nm or more, −120 nm or more, −110 nm or more, −100 nm or more, −90 nm or more, −80 nm or more, −70 nm or more, −60 nm or more, −50 nm or more, −40 nm or more, −30 nm or more, −20 nm or more, or −10 nm or more. Also, in another example, the thickness-direction retardation can be 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, 30 nm or less, 20 nm or less, or 10 nm or less.

The retardation layer can be laminated on one side of the polarizer so that its slow axis and the absorption axis of the polarizer can form an angle within a range of about 30 degrees to 60 degrees. In another example, the angle can be 35 degrees or more, or 40 degrees or more, and can also be 55 degrees or less, or 50 degrees or less.

The circularly polarizing plate of the present application can have other various structures as long as the polarizer and the retardation layer are basically included.

For example, the circularly polarizing plate can comprise an additional layer (hereinafter, outer layer) laminated on the opposite surface of the polarizer facing the retardation layer. FIG. 3 is an example of a case where the outer layer (301) is formed on the upper part of the polarizer (101).

As the type of the outer layer, a polarizer protective film, a hard coating layer, a retardation film, an antireflection layer or a liquid crystal coating layer, and the like can be exemplified, without being limited thereto. The specific type of each constitution used as the outer layer is not particularly limited, and for example, various kinds of films used for constituting an optical film such as a polarizing plate in the industry can be used without limitation.

For example, the outer layer can be an optical film having an in-plane retardation of 10 nm or less for a wavelength of 550 nm. The optical film can be a protective film of the polarizer. As the protective film, various films known in the industry can be applied.

The outer layer can also be a retardation layer having a quarter-wave phase delay characteristic. Such a retardation layer can also be configured by using a retardation film or a liquid crystal coating layer among the above-mentioned outer layers. Therefore, the circularly polarizing plate can further comprise an optical film (retardation layer) laminated on the opposite surface of the polarizer (101) facing the retardation layer (102) and having an in-plane retardation in a range of 90 nm to 300 nm for a wavelength of 550 nm. In another example, the in-plane retardation of the retardation layer can be 100 nm or more, 105 nm or more, 110 nm or more, 115 nm or more, 120 nm or more, 125 nm or more, or 130 nm or more. Also, the in-plane retardation can be 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, or 145 nm or less.

The above-mentioned outer layer can be a single layer or a multilayer structure. An example of the single layer structure can be exemplified by a single layer structure of the polarizer protective film or a single layer structure of the retardation film, which is the retardation layer having the quarter-wave phase delay characteristic, and the like, and the multilayer structure can be exemplified by a structure in which a hard coating layer, a liquid crystal coating layer having a quarter-wave phase delay characteristic and/or an antireflection layer are formed on the polarizer protective film and/or the retardation film, and the hard coating layer, the liquid crystal having a quarter-wave phase delay characteristic and the antireflection layer, and the like can be present as any one layer of them, or can also be present as a multilayer of two or more layers.

The circularly polarizing plate can further comprise an additional layer (hereinafter, lower layer) laminated on the opposite side of the surface of the retardation layer facing the polarizer. FIG. 4 is an example of a case where the lower layer (401) is formed on one side of the retardation layer (102). In the same case as FIG. 4, the same outer layer (301) as FIG. 3 can also be added. For example, as in FIG. 4, in the state where the lower layer (401) is present, an outer layer such as a hard coating layer or a low reflection layer can exist on the outer side of the polarizer (101), and a protective film can also exist on one side or both sides of the polarizer (101).

The type of the lower layer can be exemplified by a retardation layer, or a pressure-sensitive adhesive layer or an adhesive layer for attaching the circularly polarizing plate to another element, or a protective film or a release film for protecting the pressure-sensitive adhesive layer or the adhesive layer.

When a retardation layer is used as the lower layer, the layer satisfying the refractive index relationship of the following Equation 9 or 10 can be applied. The addition of such a layer allows the circularly polarizing plate to exhibit the desired properties for the light incident in the oblique direction.

$$nx>ny \text{ and } nz>ny \quad \text{[Equation 9]}$$

$$nx=ny<nz \quad \text{[Equation 10]}$$

In Equations 9 and 10, nx is the refractive index in the slow axis direction of the retardation layer, ny is the refractive index in the fast axis direction of the retardation layer, and nz is the refractive index in the thickness direction of the retardation layer.

The circularly polarizing plate can further comprise an optical film, as a retardation layer which is the lower layer, present on the lower part of the retardation layer and having thickness-direction retardation in a range of 10 to 400 nm. The optical film can be a retardation layer satisfying the refractive index relationship of Equation 9 or 10 above.

In another example, the upper limit of the thickness-direction retardation of the optical film can be 370 nm or less, 350 nm or less, 330 nm or less, 300 nm or less, 270 nm, 250 nm, 240 nm, 230 nm, 220 nm, 200 nm, 190 nm, 180 nm, 170 nm, 160 nm, 155 nm, 150 nm, 130 nm, 120 nm, 110 nm, 100 nm, 80 nm or 70 nm. Also, in another example, the lower limit of the thickness-direction retardation of the optical film can be 5 nm, 10 nm, 20 nm, 40 nm, 50 nm, 90 nm, 100 nm, 110 nm, 120 nm or 150 nm. It is possible to provide a circularly polarizing plate having excellent reflection characteristics and luminosity characteristics, in particular, reflection characteristics and visual sensitivity characteristics at an oblique angle, by adjusting the thickness-direction retardation of the optical film as above.

When the optical film is an optical film satisfying Equation 9 above, the in-plane retardation thereof can be, for example, more than 0 nm, and 300 nm or less, 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, 30 nm or less, 20 nm or less, or 10 nm or less.

Furthermore, when the optical film is an optical film satisfying Equation 9 above, the optical film can be arranged such that its slow axis is perpendicular or horizontal to the absorption axis of the polarizer. In this specification, the term vertical, orthogonal, horizontal or parallel means substantially vertical, orthogonal, horizontal or parallel in a range that does not impair the desired effect. Therefore, the terms can each include, for example, an error within ±15 degrees, within ±10 degrees, within ±5 degrees, or within ±3 degrees.

In another example, when the optical film is an optical film satisfying Equation 9 above, it can also be arranged such that its slow axis can form an angle in a range of about 30 degrees to 60 degrees with the absorption axis of the polarizer. In another example, the angle can be 35 degrees or more, or 40 degrees or more, and also can be 55 degrees or less, or 50 degrees or less.

In the circularly polarizing plate, a separate layer may or may not exist between the polarizer and the retardation layer.

Here, the case that no separate layer exists between the polarizer and the retardation layer is the case that the polarizer and the retardation layer are directly attached, where in this case, other layers may not be present except for a layer for bonding the polarizer and the retardation layer, for example, a pressure-sensitive adhesive layer, an adhesive layer and/or a primer layer, and the like.

In addition, even when a separate layer exists or does not exist between the polarizer and the retardation layer, no birefringent layer can exist at least between the polarizer and the retardation layer. In this case, the birefringent layer means a layer having at least one of the in-plane retardation and the thickness-direction retardation of 10 nm or more.

FIG. 5 is an example of a case where a separate layer (middle layer) (501) exists between the polarizer (101) and the retardation layer (102). The middle layer can be exemplified by the polarizer protective film or retardation layer as described above. Although not shown even in the structure of FIG. 5, the outer layer (301) of the structure of FIG. 3 and/or the lower layer (401) of the structure of FIG. 4 can also be present.

For example, the circularly polarizing plate can further comprise an optical film present between the polarizer and the retardation layer, and having an in-plane retardation of 5 nm or less for a wavelength of 550 nm and a thickness-direction retardation for a wavelength of 550 nm in a range of −60 nm to 0 nm, where this optical film can be, for example, a protective film of a polarizer.

In another example, the circularly polarizing plate can further comprise an optical film present between the polarizer and the retardation layer and having an in-plane retardation for a wavelength of 550 nm of 10 nm or less and a thickness-direction retardation for a wavelength of 550 nm in a range of 40 nm to 400 nm. Such an optical film can be a retardation layer, which can be, for example, a layer satisfying any one of refractive index relationships of Equations 9 to 10, or can be a spray-oriented liquid crystal cured layer, or a tilt-oriented liquid crystal cured layer.

In one example, the circularly polarizing plate can further comprise an optically anisotropic layer present between the polarizer and the retardation layer and having a retardation layer which has Nz of −4.0 or less in the following Equation 11 or satisfies the following Equation 10.

$$nx=ny<nz \quad \text{[Equation 10]}$$

$$Nz=(nx-nz)/(nx-ny) \quad \text{[Equation 11]}$$

In Equations 10 and 11, nx is the refractive index in the slow axis direction of the retardation layer, ny is the refractive index in the fast axis direction of the retardation layer, and nz is the refractive index in the thickness direction of the retardation layer.

Also, in this case, the optically anisotropic layer can further comprise a retardation layer that the Nz value in Equation 11 is in the range of 0.8 to 1.2, and the in-plane slow axis is parallel or orthogonal to the absorption axis of the polarizer.

For example, the retardation layer having Nz of −4.0 or less in Equation 11 or satisfying Equation 10 is adjacent to the polarizer as compared with the retardation layer having the Nz value of Equation 11 above in the range of 0.8 to 1.2, and the in-plane slow axis of the retardation layer having the Nz value of Equation 11 above in the range of 0.8 to 1.2 can be arranged to be parallel to the absorption axis of the polarizer.

In addition, the retardation layer having the Nz value of Equation 11 above in the range of 0.8 to 1.2 is adjacent to the polarizer as compared with the retardation layer having the Nz in Equation 11 above of −4.0 or less or satisfying Equation 10, and the in-plane slow axis of the retardation layer having the Nz value of Equation 11 above in the range of 0.8 to 1.2 can also be orthogonal to the absorption axis of the polarizer.

Furthermore, the retardation layer having the Nz value of Equation 11 in the range of 0.8 to 1.2 is adjacent to the polarizer as compared with the retardation layer having the Nz of −4.0 or less in Equation 11 above or satisfying Equation 10, and the in-plane slow axis of the retardation layer having the Nz value of Equation 11 above in the range of 0.8 to 1.2 can also be parallel to the absorption axis of the polarizer.

In addition, the retardation layer having Nz of −4.0 or less in Equation 11 above or satisfying Equation 10 is adjacent to the polarizer as compared with the retardation layer having the Nz value of Equation 11 above in the range of 0.8 to 1.2, and the in-plane slow axis of the retardation layer having the Nz value of Equation 11 above in the range of 0.8 to 1.2 can also be arranged to be orthogonal to the absorption axis of the polarizer.

In this case, the thickness-direction retardation of the retardation layer having the Nz of −4.0 or less in Equation 11 above or satisfying Equation 10 can be in a range of 30 nm to 200 nm, and the Nz value of Equation 11 above can be −4.0 or less.

In addition, the in-plane retardation of the retardation layer having the Nz value of Equation 11 above in the range of 0.8 to 1.2 can be in a range of 30 nm to 180 nm for light having a wavelength of 550 nm.

In another example, the circularly polarizing plate can further comprise a retardation layer present between the polarizer and the retardation layer and satisfying the following Equation 9.

$$nx > ny \text{ and } nz > ny \quad \text{[Equation 9]}$$

In Equation 9, nx is the refractive index in the slow axis direction of the retardation layer, ny is the refractive index in the fast axis direction of the retardation layer, and nz is the refractive index in the thickness direction of the retardation layer.

In this case, the in-plane retardation of the retardation layer can be in a range of 70 to 200 nm, and the in-plane slow axis thereof can be parallel or orthogonal to the absorption axis of the polarizer. Also, the Nz of the retardation layer according to Equation 11 above can be in a range of −0.2 to 0.8.

In another example, the circularly polarizing plate can further comprise a retardation layer having a plurality of optical axes whose inclination angles vary along the thickness direction, for example, a spray-oriented liquid crystal cured layer between the polarizer and the retardation layer.

The projection of all the optical axes of the retardation layer onto the plane can be parallel or orthogonal to the absorption axis of the polarizer.

When the retardation layer is a liquid crystal cured layer, the cured layer can comprise a liquid crystal material having refractive index anisotropy of 0.03 to 0.2.

Also, the liquid crystal cured layer can comprise rod-shaped liquid crystal molecules or can include disk-shaped liquid crystal molecules.

In this case, the optical axis of the retardation layer can be gradually changing along the thickness direction of the retardation layer such that the inclination angle is 70 degrees to 90 degrees on one surface of the retardation layer and the inclination angle is 0 degrees to 20 degrees on the other surface facing it.

When the rod-shaped liquid crystal molecules are included, the optical axis can be gradually changing along the thickness direction such that the inclination angle of the optical axis of the retardation layer is 70 degrees to 90 degrees on both surfaces of the retardation layer, respectively and it is 0 degrees to 70 degrees in the middle portion in the thickness direction.

When the rod-shaped liquid crystal molecules are included, the optical axis can be gradually changing along the thickness direction such that the inclination angle of the optical axis of the retardation layer is 0 degrees to 20 degrees on both surfaces of the retardation layer, respectively and it is 40 degrees to 90 degrees in the middle portion in the thickness direction.

When the disk-shaped liquid crystal molecules are included, the optical axis can be gradually changing along the thickness direction such that the inclination angle of the optical axis of the retardation layer is 70 degrees to 90 degrees on both surfaces of the retardation layer, respectively and it is 0 degrees to 30 degrees in the middle portion in the thickness direction.

When the disk-shaped liquid crystal molecules are included, the optical axis can be gradually changing along the thickness direction such that the inclination angle of the optical axis of the retardation layer is 0 degrees to 20 degrees on both surfaces of the retardation layer, respectively and it is 20 degrees to 50 degrees in the middle portion in the thickness direction.

Also, in another example, the circularly polarizing plate can further comprise a retardation layer having an optical axis inclined uniformly along the thickness direction, for example, a tilt-oriented liquid crystal cured layer between the polarizer and the retardation layer.

Here, the projection of the retardation layer onto the plane of the optical axis can be parallel to the absorption axis of the polarizer.

The retardation layer, which is a liquid crystal cured layer, can comprise liquid crystal molecules having refractive index anisotropy in a range of 0.03 to 0.2.

Also, the liquid crystal molecules can be rod-shaped liquid crystal molecules, for example, nematic liquid crystals.

In this case, the inclination angle of the optical axis of the retardation layer can be in a range of 25 degrees to 65 degrees, and the thickness can be in a range of 0.35 μm to 2.2 μm.

Furthermore, in another example, the inclination angle of the optical axis of the retardation layer can be in a range of 35 degrees to 50 degrees, and the thickness can be 0.4 μm to 2.2 μm.

In another example, the liquid crystal molecules can be disk-shaped liquid crystal molecules, for example, discotic liquid crystals.

In this case, the inclination angle of the optical axis of the retardation layer can be in a range of 10 degrees to 35 degrees, and the thickness can be in a range of 1 μm to 3 μm.

The liquid crystal composition, the retardation layer or the circularly polarizing plate can be used for providing a display device. An exemplary display device can comprise the circularly polarizing plate.

The specific kind of the display device comprising the circularly polarizing plate is not particularly limited. The device can be, for example, a liquid crystal display such as a reflective type or semi-transmissive reflective type liquid crystal display, or can be an organic light emitting device or the like.

The arrangement type of the circularly polarizing plate in the display device is not particularly limited, and for example, a known type can be adopted. For example, in a reflective type liquid crystal display, the circularly polarizing plate can be used as any one circularly polarizing plate among the circularly polarizing plates of a liquid crystal panel for preventing reflection of external light and ensuring visibility.

In addition, when the circularly polarizing plate is applied to the organic light emitting device, the organic light emitting device can comprise a reflective electrode, a transparent electrode, an organic layer interposed between the reflective electrode and the transparent electrode and having a light emitting layer, and the circularly polarizing plate. The circularly polarizing plate can be present outside the reflective or transparent electrode and a retardation layer can be disposed closer to the reflective or transparent electrode than a linear polarizer.

Advantageous Effects

The present application can provide a liquid crystal composition having a reverse wavelength dispersion property and excellent high temperature durability. Such a liquid crystal composition can be applied to a retardation layer, a circularly polarizing plate, or a display device, for example, an organic light emitting display device.

BRIEF DESCRIPTION OF DRAWINGS

FIG. 1 exemplarily shows the circularly polarizing plate of the present application.

FIG. 2 exemplarily shows the x-axis, the y-axis and the z-axis.

FIG. 3 exemplarily shows the circularly polarizing plate of the present application.

FIG. 4 exemplarily shows the circularly polarizing plate of the present application.

FIG. 5 exemplarily shows the circularly polarizing plate of the present application.

EXAMPLES

Hereinafter, the present application will be specifically described by way of examples, but the scope of the present application is not limited by the following examples.

Measurement Example 1 Measurement of Retardation Value

An in-plane or thickness-direction retardation was measured for light having a wavelength of 550 nm using an Axoscan instrument (Axomatrics) capable of measuring 16 Muller matrices. Using the Axoscan instrument, 16 Muller matrices were obtained according to the manufacturer's manual, through which retardation was extracted.

Example 1

Preparation of Liquid Crystal Composition 1.75 g of a polymerizable liquid crystal compound (UCL-R17, DIC) having a reverse wavelength dispersion property, 0.175 g of a non-liquid crystalline epoxy compound (neopentyl glycol diglycidyl ether) and 0.0175 g of a cationic initiator (CPI-100P, Sanapro) were mixed with 3.25 g of a toluene solvent to prepare a liquid crystal composition. The polymerizable liquid crystal compound has an R (450)/R (550) value of 0.86 and an R (650)/R (550) value of 1.01.

Production of Retardation Layer

The liquid crystal composition was applied on a triacetyl cellulose (TAC) base material to have a thickness of about 2 μm after drying, irradiated with ultraviolet rays of a UVB region wavelength (about 300 nm) at a light quantity of 200 mJ/cm$^2$ in the total irradiance level in a state of being oriented on the xy plane and cured to produce a retardation layer. The light quantity was measured using a UV power puck II.

Example 2

A retardation layer was produced in the same manner as in Example 1, except that in Example 1, the non-liquid crystalline epoxy compound was changed to 1,4-cyclohexane dimethanol diglycidyl ether.

Example 3

A retardation layer was produced in the same manner as in Example 1, except that in Example 1, the non-liquid crystalline epoxy compound was changed to 1,4-butanediol diglycidyl ether.

Example 4

A retardation layer was produced in the same manner as in Example 1, except that in Example 1, the non-liquid crystalline epoxy compound was changed to trimethylolpropane triglycidyl ether.

Example 5

A retardation layer was produced in the same manner as in Example 1, except that in Example 1, the non-liquid crystalline epoxy compound was changed to 3',4'-epoxycyclohexanemethyl-3,4-epoxycyclohexylcarboxylate (Celloxide 2021p, Daicel).

Comparative Example 1

A retardation layer was produced in the same manner as in Example 1, except that in Example 1, the non-liquid crystalline epoxy compound and the cationic initiator were not used in the liquid crystal composition.

Comparative Example 2

A retardation layer was produced in the same manner as in Example 1, except that in Example 1, the non-liquid crystalline epoxy compound was changed to 2-ethylhexyl monoglycidyl ether.

Comparative Example 3

A retardation layer was produced in the same manner as in Example 1, except that in Example 1, the non-liquid crystalline epoxy compound was changed to GMA (glycidyl methacrylate) having an acryl group.

Reference Example 1

1.75 g of a polymerizable liquid crystal compound (RM257, BASF) having a normal wavelength dispersion property was mixed with 3.25 g of a toluene solvent to prepare a liquid crystal composition. The polymerizable liquid crystal compound has an R (450)/R (550) value of 1.09, and an R (650)/R (550) value of 0.95. The liquid crystal composition was cured in the same manner as in Example 1 to produce a retardation layer.

Reference Example 2

1.75 g of a polymerizable liquid crystal compound (RM257, BASF) having a normal wavelength dispersion property, 0.175 g of a non-liquid crystal epoxy compound (neopentyl glycol diglycidyl ether) and 0.0175 g of a cationic initiator (CPI-100P, Sanapro) were mixed with 3.25 g of a toluene solvent to prepare a liquid crystal composition. The liquid crystal composition was cured in the same manner as in Example 1 to produce a retardation layer.

Evaluation Example 1 Evaluation of High Temperature Durability

For the Examples, Comparative Examples and Reference Examples, initial retardation values and change rates of the retardation values after high temperature storage were measured according to the following Equation 6, and the results were described in Tables 1 and 2 below.

$$\Delta Rin = (1 - Rin_2/Rin_1) \times 100 \quad \text{[Equation 6]}$$

ΔRin is an in-plane retardation change rate after high temperature storage, Rin is an initial in-plane retardation value at 25° C., and Rin₂ is an in-plane retardation value after high temperature storage at 80° C. for 24 hours or 96 hours.

As described in Table 1, Comparative Example 1, which is a retardation layer comprising a polymerizable liquid crystal compound having a reverse wavelength dispersion property, exhibits a retardation change rate of 7.8% after high temperature storage for 24 hours and a retardation change rate of 8.5% after high temperature storage for 96 hours, whereby it can be confirmed that the retardation change rate after high temperature storage is large. In Examples 1 to 5 in which the multifunctional non-liquid crystalline epoxy compound was added, the retardation change amount after high temperature storage was reduced to 3% or less. On the other hand, in Comparative Example 2 in which the monofunctional non-liquid crystalline epoxy compound was added, and Comparative Example 3 in which the non-liquid crystalline epoxy compound having an acryl group was added, the retardation change amount after high temperature storage was instead increased.

As described in Table 2, it can be confirmed that Reference Example 1, which is a retardation layer comprising a polymerizable liquid crystal compound having a normal wavelength dispersion property, has a relatively smaller retardation change amount even after high temperature storage as compared with Comparative Example 1. Also, in Reference Example 2 in which the multifunctional non-liquid crystalline epoxy compound was added, the retardation change amount did not significantly decrease even after high temperature storage.

TABLE 1

|  |  | Initial Rin (nm) | 24 hr Change Amount Rin (%) | 96 hr Change Amount Rin (%) |
|---|---|---|---|---|
| Comparative Example | 1 | 144.5 | 7.8 | 8.5 |
|  | 2 | 138.7 | 7.5 | 8.1 |
|  | 3 | 141.1 | 7.3 | 8.2 |
| Example | 1 | 137.5 | 1.8 | 2.0 |
|  | 2 | 136.6 | 2.2 | 2.5 |
|  | 3 | 132.1 | 2.0 | 2.7 |
|  | 4 | 133.3 | 2.4 | 2.6 |
|  | 5 | 135 | 2.6 | 3.0 |

TABLE 2

|  |  | Initial Rin (nm) | 24 hr Change Amount Rin (%) | 96 hr Change Amount Rin (%) |
|---|---|---|---|---|
| Reference Example | 1 | 136.3 | 1.5 | 2.0 |
|  | 2 | 135.5 | 2.1 | 2.3 |

EXPLANATION OF REFERENCE NUMERALS

101: polarizer, 102: retardation layer, 100: retardation layer, 301: outer layer, 401: lower layer, 501: middle layer

The invention claimed is:

1. A liquid crystal composition, comprising:
    a polymerizable liquid crystal compound having a reverse wavelength dispersion property; and
    a non-liquid crystalline epoxy compound having two or more epoxy groups,
    wherein the non-liquid crystalline epoxy compound has no radical-curable functional group,
    wherein the non-liquid crystalline epoxy compound is one of the following Formula 7 or 8 and
    wherein after the liquid crystal composition is irradiated with ultraviolet rays of UVB region wavelengths at a light quantity of 100 mJ/cm² to 250 mJ/cm² in the total irradiance level and cured, and it has an in-plane retardation change rate represented by the following Equation 6 of 8% or less:

Formula 7

Formula 8 wherein in Formula 7:
    X is an m-valent non-mesogenic saturated hydrocarbon group;
    n is an integer of 1 to 20; and
    m is an integer of 2 or more; and wherein in Formula 8:
Y is an m-valent non-mesogenic hydrocarbon group;
$L_9$ is a single bond, —OCO—, —COO— or —O—; and
m is an integer of 2 or more,
wherein the non-mesogenic hydrocarbon group means a hydrocarbon group having no mesogen skeleton which means a structure containing at least two aromatic groups;

$$\Delta Rin = (1 - Rin_2/Rin_1) \times 100 \qquad \text{[Equation 6]}$$

wherein ΔRin is an in-plane retardation change rate after high temperature storage, Rin1 is an initial in-plane retardation value, and Rin2 is an in-plane retardation value after high temperature storage at 80° C. for 96 hours.

2. The liquid crystal composition according to claim 1, wherein the polymerizable liquid crystal compound satisfies the following equation 1:

$$R(450)/R(550) < R(650)/R(550) \qquad \text{[Equation 1]}$$

wherein R (λ) means an in-plane retardation for light having a wavelength of λ nm.

3. The liquid crystal composition according to claim 1, wherein the polymerizable liquid crystal compound has an R (450)/R (550) value of 0.99 or less and an R (650)/R (550) value of 1.01 or more, where R (λ) means an in-plane retardation for light having a wavelength of λ nm.

4. The liquid crystal composition according to claim 1, wherein the polymerizable liquid crystal compound has a refractive index anisotropy Δn represented by the following formula of 0.03 to 0.13 for light having a wavelength of 550 nm:

Δn=ne−no wherein Δn represents a refractive index anisotropy of the polymerizable liquid crystal compound, ne represents an extraordinary refractive index of the polymerizable liquid crystal compound, no represents an ordinary refractive index of the polymerizable liquid crystal compound.

5. The liquid crystal composition according to claim 1, wherein the non-liquid crystalline epoxy compound is included in an amount of 1 to 20 parts by weight relative to 100 parts by weight of the polymerizable liquid crystal compound.

6. The liquid crystal composition according to claim 1, wherein the non-liquid crystalline epoxy compound has 2 to 8 epoxy groups.

7. The liquid crystal composition according to claim 1, wherein X and Y are each a linear, branched or cyclic m-valent non-mesogenic saturated hydrocarbon group having 1 to 20 carbon atoms.

8. The liquid crystal composition according to claim 1, wherein in Formulas 7 and 8, each m is an integer of 2 to 3.

9. The liquid crystal composition according to claim 1, wherein the non-liquid crystalline epoxy compound is one of the following Formulae 9 to 14:

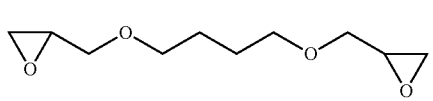

Formula 9

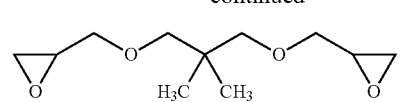

Formula 10

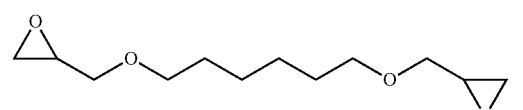

Formula 11

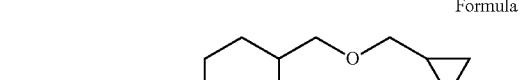

Formula 12

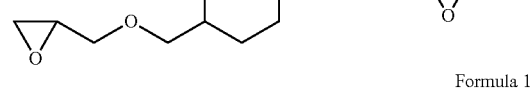

Formula 13

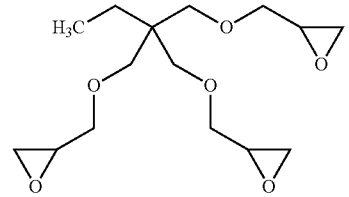

Formula 14

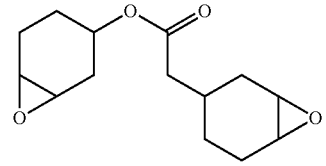

10. The liquid crystal composition according to claim 1, wherein the liquid crystal composition further comprises a cationic initiator.

11. A circularly polarizing plate comprising a linear polarizer, and a retardation layer containing a cured layer of the liquid crystal composition of claim 1.

12. The circularly polarizing plate according to claim 11, wherein the retardation layer has a quarter-wave phase delay characteristic.

13. The circularly polarizing plate according to claim 11, wherein the light absorption axis of the linear polarizer and the slow axis of the retardation layer form an angle of 40 degrees to 50 degrees.

14. An organic light emitting display device, comprising:
a reflective electrode;
a transparent electrode;
an organic layer interposed between the reflective electrode and the transparent electrode and having a light emitting layer; and
the circularly polarizing plate of claim 11,
wherein the circularly polarizing plate is present outside the reflective or transparent electrode and the retardation layer is disposed closer to the reflective or transparent electrode than the linear polarizer.

* * * * *